United States Patent
Sugiura et al.

(10) Patent No.: US 11,013,113 B2
(45) Date of Patent: May 18, 2021

(54) BASE MATERIAL FOR PRINTED CIRCUIT BOARD AND PRINTED CIRCUIT BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Motohiko Sugiura, Osaka (JP); Issei Okada, Osaka (JP); Takashi Kasuga, Osaka (JP); Yoshio Oka, Osaka (JP); Kenji Ohki, Shiga (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 0 days.

(21) Appl. No.: 16/955,351

(22) PCT Filed: Sep. 24, 2018

(86) PCT No.: PCT/JP2018/035236
§ 371 (c)(1),
(2) Date: Jun. 18, 2020

(87) PCT Pub. No.: WO2019/130690
PCT Pub. Date: Jul. 4, 2019

(65) Prior Publication Data
US 2021/0022245 A1  Jan. 21, 2021

(30) Foreign Application Priority Data

Dec. 25, 2017  (JP) .............................. JP2017-247550

(51) Int. Cl.
*H05K 1/09* (2006.01)

(52) U.S. Cl.
CPC ...... *H05K 1/092* (2013.01); *H05K 2201/0338* (2013.01); *H05K 2201/0361* (2013.01)

(58) Field of Classification Search
CPC ................................................ H05K 1/09-097
See application file for complete search history.

(56) References Cited

U.S. PATENT DOCUMENTS

2005/0236182 A1  10/2005  Hayashi et al.
2017/0347459 A1  11/2017  Miyata et al.

FOREIGN PATENT DOCUMENTS

| | | |
|---|---|---|
| JP | 2008-200557 | 9/2008 |
| JP | 2010-219075 | 9/2010 |
| JP | 2011-037214 | 2/2011 |
| JP | 2016-152405 | 8/2016 |
| WO | 2003/103352 | 12/2003 |
| WO | 2016/104391 | 6/2016 |

*Primary Examiner* — Jeremy C Norris
(74) *Attorney, Agent, or Firm* — IPUSA, PLLC

(57) ABSTRACT

According to the present invention, a base material for a printed circuit board includes: an insulating base film; and a metal layer that is layered on at least one surface of the base film and that includes copper as a main component, wherein in a content per unit area in a region of 100 nm or less from an interface of the metal layer with the base film, Cr<0.1 $mg/m^2$, and Ni<0.1 $mg/m^2$, wherein an arithmetic mean roughness (Sa) of the surface of the base film on which the metal layer is layered is less than 0.10 μm.

8 Claims, 2 Drawing Sheets

US 11,013,113 B2

BASE MATERIAL FOR PRINTED CIRCUIT BOARD AND PRINTED CIRCUIT BOARD

TECHNICAL FIELD

The present disclosure relates to a base material for a printed circuit board and a printed circuit board.

The present application is based on and claims priority to Japanese Patent Application No. 2017-247550, filed on Dec. 25, 2017, the entire contents of the Japanese Patent Application are hereby incorporated herein by reference.

BACKGROUND ART

A base material for a printed circuit board in which a metal foil is layered via an adhesive layer on the surface of an insulating base film is known. Also, in response to recent size reduction of electronic components, a base material for a printed circuit board in which a metal layer is directly layered on the surface of a base film is also proposed. As such a base material for a printed circuit board, a base material for a printed circuit board in which a seed layer is layered on the surface of a base film using a sputtering method is proposed (see Japanese Laid-open Patent Publication No. 2011-37214).

The base material for a printed circuit board described in the above described publication includes a base film made of a polyimide film and a seed layer (underlayer) layered on the surface of the base film. The seed layer is formed by layering a nickel-chromium alloy layer and a copper layer on the surface of the base film in this order by a sputtering method.

PRIOR ART DOCUMENT

Patent Document

[Patent Document 1] Japanese Laid-open Patent Publication No. 2011-37214

SUMMARY OF THE INVENTION

According to one aspect of the present disclosure, a base material for a printed circuit board includes: an insulating base film; and a metal layer that is layered on at least one surface of the base film and that includes copper as a main component, wherein in a content per unit area in a region of 100 nm or less from an interface of the metal layer with the base film, Cr<0.1 mg/m$^2$, and Ni<0.1 mg/m$^2$, and wherein an arithmetic mean roughness (Sa) of the surface of the base film on which the metal layer is layered is less than 0.10 μm.

According to another aspect of the present disclosure, a printed circuit board uses the base material for a printed circuit board.

EMBODIMENT FOR CARRYING OUT THE INVENTION

Figure 1:
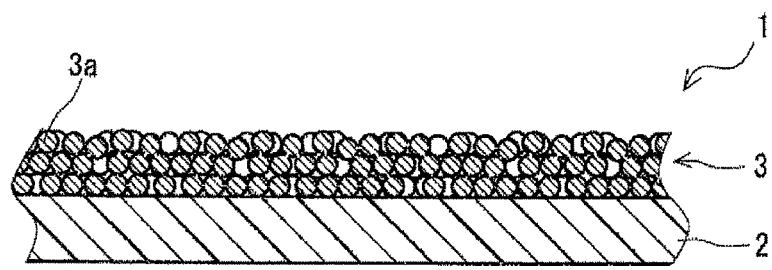
FIG. 1 is a schematic cross-sectional view illustrating a base material for a printed circuit board according to one embodiment of the present disclosure.

Problem to Be Solved by the Present Disclosure

As described in the above publication, in a case in which a seed layer is formed using a sputtering method, a nickel-chromium alloy layer is disposed between a base film and a copper layer to enhance migration resistance. However, nickel and chromium are more difficult to etch than copper. Also, when a nickel-chromium alloy layer is present between the base film and the copper layer, etching of the copper layer and etching of the nickel-chromium alloy layer are required to be performed separately. Therefore, the base material for a printed circuit board described in the above publication tends to require a long time for etching and to deteriorate the etching accuracy. Therefore, according to this base material for a printed circuit board, it is difficult to form a fine circuit.

In view of the above, the present disclosure has an object to provide a base material for a printed circuit board and a printed circuit board that enable to easily form a fine circuit.

Effect of the Present Disclosure

A base material for a printed circuit board and a printed circuit board according to the present disclosure enable to easily form a fine circuit.

DESCRIPTION OF EMBODIMENTS OF THE PRESENT DISCLOSURE

First, aspects of the present disclosure will be listed and described.

According to one aspect of the present disclosure, a base material for a printed circuit board includes: an insulating base film; and a metal layer that is layered on at least one surface of the base film and that includes copper as a main component, wherein in a content per unit area in a region of 100 nm or less from an interface of the metal layer with the base film, Cr<0.1 mg/m$^2$, and Ni<0.1 mg/m$^2$, and wherein an arithmetic mean roughness (Sa) of the surface of the base film on which the metal layer is layered is less than 0.10 μm.

In the base material for a printed circuit board, because the contents of Cr and Ni per unit area in the region of 100 nm or less from the interface of the metal layer with the base film are small and are within the above described ranges, etching of the metal layer is relatively easy. Also, in the base material for a printed circuit board, because the arithmetic mean roughness (Sa) of the surface of the base film on which the metal layer is layered is within the above described range, it is possible to suppress a decrease in etching accuracy due to protrusions/recesses on the surface of the base film. Therefore, according to the base material for a printed circuit board, it is possible to perform etching with high accuracy. Accordingly, the base material for a printed circuit board enables to easily form a fine circuit.

It is preferable that the metal layer includes sintered bodies of copper particles fixed to the base film. In this manner, by the metal layer including sintered bodies of copper particles fixed to the base film, it is possible to form a fine circuit at a low cost without requiring expensive vacuum equipment that is required for physical vapor deposition, such as sputtering.

It is preferable that an average particle size of the sintered bodies is greater than or equal to 50 nm and less than or equal to 300 nm. By the average particle size of the sintered bodies being within the above described range, a dense metal layer can be easily and reliably formed, and thus a fine circuit is easily formed.

It is preferable that, in the content per unit area in the region of 100 nm or less from the interface of the metal layer with the base film, Pd<0.1 mg/m². In a case in which the content of Pd in the above described region is large, etching for removing Pd is additionally required in addition to etching for removing copper. With respect to the above, by the content of Pd per unit area in the region of 100 nm or less from the interface of the metal layer with the base film being within the above described range, a fine circuit can be formed without separately performing etching to remove Pd.

It is preferable that, in the content per unit area in the region of 100 nm or less from the interface of the metal layer with the base film, 0.001 mg/m²≤Ti≤0.05 mg/m². By the content of Ti per unit area in the region of 100 nm or less from the interface of the metal layer with the base film being within the above range, diffusion of copper into the base film can be suppressed, and a dense metal layer can be formed.

It is preferable that the average particle size of the sintered bodies is greater than or equal to 70 nm and less than or equal to 200 nm. According to this configuration, it is possible to form a fine circuit.

According to another aspect of the present disclosure, a printed circuit board uses the base material for a printed circuit board. Because the printed circuit board uses the base material for a printed circuit board, it is easy to form a fine circuit.

It is preferable that the printed circuit board includes an electroplating layer on an outer surface of the metal layer. Because the metal layer of the printed circuit board is dense, an electroplating layer can be directly provided on the outer surface of the metal layer without layering an electroless plating layer on the outer surface of the metal layer. As a result, the manufacturing efficiency can be increased and the cost reduction can be promoted.

It should be noted that, in the present disclosure, the "main component" refers to a component whose content by mass is the largest, and for example, refers to a component whose content is greater than or equal to 50% by mass, is preferably a component whose content is greater than or equal to 80% by mass, and is more preferably a component whose content is greater than or equal to 90% by mass. The "content per unit area in the region of 100 nm or less from the interface of the metal layer with the base film" refers to a value that is measured by ICP-MS (Inductively Coupled Plasma Mass Spectrometry). The "arithmetic mean roughness (Sa)" refers to a parameter obtained by three-dimensionally extending the "arithmetic mean roughness (Ra)" defined in JIS-B0601: 2001 and refers to a value that is measured in a measurement range of 30 μm×30 μm and a cutoff value of 90. The "average particle size of sintered bodies" means a particle size at which a volume integrated value is 50% in a particle size distribution measured by a surface SEM.

Details of Embodiment of the Present Disclosure

In the following, preferable embodiments of the present disclosure will be described with reference to the drawings.

First Embodiment

<Base Material for Printed Circuit Board>

A base material 1 for a printed circuit board illustrated in FIG. 1 includes an insulating base film 2 and a metal layer 3 that is layered on one surface of the base film 2 and that includes copper as the main component. The base material 1 for a printed circuit board is a base material for a flexible printed circuit board and has flexibility. In the base material 1 for a printed circuit board, in a content per unit area in a region of 100 nm or less from an interface of the metal layer 3 with the base film 2, Cr<0.1 mg/m², and Ni<0.1 mg/m². Also, in the base material 1 for a printed circuit board, an arithmetic mean roughness (Sa) of the surface of the base film 2 on which the metal layer 3 is layered is less than 0.10 μm.

In the base material 1 for a printed circuit board, because the contents of Cr and Ni per unit area in the region of 100 nm or less from the interface of the metal layer 3 with the base film 2 are small and are within the above described ranges, etching of the metal layer 3 is relatively easy. For example, etching of Cr and Ni is not required to be performed separately from etching of copper. Also, in the base material 1 for a printed circuit board, because the arithmetic mean roughness (Sa) of the surface of the base film 2 on which the metal layer 3 is layered is within the above described range, it is possible to suppress a decrease in etching accuracy due to protrusions/recesses on the surface of the base film 2. Therefore, according to the base material 1 for a printed circuit board, it is possible to perform etching with high accuracy. Accordingly, the base material 1 for a printed circuit board enables to easily form a fine circuit.

(Metal Layer)

The metal layer 3 constitutes a seed layer of base material 1 for a printed circuit board. The metal layer 3 is layered directly (i.e., without interposing another layer such as an adhesive layer) on one surface of the base film 2. The metal layer 3 includes sintered bodies 3a of copper particles fixed to the base film 2. That is, the metal layer 3 is not formed by a sputtering method. Because the base material 1 for a printed circuit board does not require expensive vacuum equipment that is required for physical vapor deposition, such as sputtering, when forming the metal layer 3, a fine circuit can be formed at a low cost. In addition, because the metal layer 3 is not formed by a sputtering method, even if the content of Cr and Ni in the region of 100 nm or less from the interface with the base film 2 of the metal layer 3 is reduced, the base material 1 for a printed circuit board has sufficient migration resistance.

In the base material 1 for a printed circuit board, by adjusting the contents of metal components per unit area in the region of 100 nm or less from the interface with the base film 2 of the metal layer 3, a fine circuit can be easily formed. The lower limit of the content of copper (Cu) per unit area in the region of 100 nm or less from the interface with the base film 2 of the metal layer 3 is preferably 500 mg/m² and is more preferably 600 mg/m². When the content of Cu per unit area in the above described region is less than the lower limit, it may be difficult to form a metal layer 3 that is inexpensive, has low resistance, and has excellent etching properties. On the other hand, the upper limit of the content of Cu per unit area in the above described region can be, for example, 894 mg/m$^2$ for ease of adjustment with other components, which will be described later below.

The content of Cr per unit area in the region of 100 nm or less from the interface with the base film 2 of the metal layer 3 is less than 0.1 mg/m$^2$ as described above. Because Cr is more difficult to etch than copper, when the content of Cr per unit area in the above described region exceeds the upper limit, the etching accuracy deteriorates, and thus it is difficult to form a printed circuit board including a fine circuit. Also, when the content of Cr per unit area in the above described region exceeds the upper limit, etching of Cr may be required to be performed separately from etching of copper, resulting in longer etching time and a decrease in manufacturing efficiency of printed circuit boards. The upper limit of the content of Cr per unit area in the above described region is preferably 0.05 mg/m$^2$ and is more preferably 0.01 mg/m$^2$. By the content of Cr per unit area in the above described region being less than the upper limit, etching can be made easily and etching accuracy can be increased. On the other hand, the lower limit of the content of Cr per unit area in the above described region is not particularly limited, and can be 0.00 mg/m$^2$.

The content per of Ni unit area in the region of 100 nm or less from the interface with the base film 2 of the metal layer 3 is less than 0.1 mg/m$^2$ as described above. Because Ni is more difficult to etch than copper, when the content of Ni per unit area in the above described region exceeds the upper limit, the etching accuracy deteriorates, and thus it is difficult to form a printed circuit board including a fine circuit. Also, when the content of Ni per unit area in the above described region exceeds the upper limit, etching of Ni may be required to be performed separately from etching of copper, resulting in longer etching time and a decrease in manufacturing efficiency of printed circuit boards. The upper limit of the content of Ni per unit area in the above described region is preferably 0.05 mg/m$^2$ and is more preferably 0.01 mg/m$^2$. By the content of Ni per unit area in the above described region being less than the upper limit, etching can be made easily and etching accuracy can be further increased. On the other hand, the lower limit of the content of Ni per unit area in the above described region is not particularly limited, and can be 0.00 mg/m$^2$.

It is preferable that the content of palladium (Pd) per unit area in the region of 100 nm or less from the interface with the base film 2 of the metal layer 3 is less than 0.1 mg/m$^2$. Also, the upper limit of the content of Pd per unit area in the above described region is more preferably 0.05 mg/m$^2$. Conventionally, in a case in which a metal layer is layered on one surface of the base film, a catalyst containing Pd is adhered on the one surface of the base film, and then a metal layer is formed by electroless copper plating. However, according to this configuration, the content of Pd in the above described region increases, and etching to remove Pd is required in addition to etching to remove copper. With respect to the above, in the base material 1 for a printed circuit board, because it is possible to form a dense metal layer 3 without electroless plating, it is easy to adjust the content of Pd to be in the above described range. By the content of Pd per unit area in the above described region being within the above described range, a fine circuit can be formed without etching to remove Pd. It should be noted that the lower limit of the content of Pd per unit area in the above described region is not particularly limited, and can be 0.00 mg/m$^2$.

The lower limit of the content of Ti per unit area in the region of 100 nm or less from the interface with the base film 2 of the metal layer 3 is preferably 0.001 mg/m$^2$ and is more preferably 0.01 mg/m$^2$. On the other hand, the upper limit of the content of Ti per unit area in the above described region is preferably 0.05 mg/m$^2$ and is more preferably 0.04 mg/m$^2$. As described below, the metal layer 3 is formed using, for example, copper particles obtained by a titanium redox method. Thus, the content of Ti per unit area in the above described region is easily adjusted to be in the region as described above. By precipitating Ti in a layered structure in the metal layer 3, it is possible to suppress copper from diffusing into the base film 2. When the content of Ti per unit area in the above described region is less than the above described lower limit, diffusion of copper into the base film 2 may not be sufficiently suppressed. Conversely, when the content of Ti per unit area in the above described region exceeds the above described upper limit, etching may not be easily performed and etching accuracy may not be sufficiently enhanced.

The lower limit of the content of sodium (Na) per unit area in the region of 100 nm or less from the interface with the base film 2 of the metal layer 3 is preferably greater than 0 mg/m$^2$ and is more preferably 1 mg/m$^2$. On the other hand, the upper limit of the content of Na per unit area in the above described region is preferably 50 mg/m$^2$ and is more preferably 40 mg/m$^2$. When the content of Na per unit area in the above described region is less than the lower limit as described above, the adhesion of the sintered bodies 3a and the base film 2 may be insufficient, or copper may diffuse into the base film 2. Conversely, when the content of Na per unit area in the above described region exceeds the above described upper limit, etching may not be easily performed and etching accuracy may not be sufficiently enhanced. It should be noted the content of Na per unit area in the region described above can be adjusted by, for example, alkali-treating the surface of the base film 2 on which the metal layer 3 is layered with a sodium hydroxide solution having an appropriate concentration.

It is preferable that copper oxide (CuO or $Cu_2O$) or a group derived from the copper oxide is present in the vicinity of the interface between the base film 2 and the metal layer 3. The copper oxide or the group derived from the copper oxide is generated based on copper particles contained in the conductive ink when sintering a coating film or the like which will be described later below. It should be noted that the "vicinity of the interface between the base film and the metal layer" means a region within a predetermined range in the thickness direction from the interface between the base film and the metal layer, respectively, and preferably is a region of 0.1 nm or more and 20 nm or less in the thickness direction from the interface.

The lower limit of the content per unit area of copper oxide or the group derived from copper oxide in the vicinity of the interface between the base film 2 and the metal layer 3 is preferably 0.10 μg/cm$^2$ and is more preferably 0.15 μg/cm$^2$. On the other hand, the upper limit of the content is preferably 10 μg/cm$^2$ and is more preferably 5 μg/cm$^2$. When the content is less than the lower limit as described above, the adhesion of the sintered bodies 3a with the base film 2 may be insufficient, or copper may diffuse into the base film 2. Conversely, when the content exceeds the upper limit as described above, it may be difficult to control the thermal treatment of the conductive ink.

The lower limit of the average particle size of the sintered bodies 3a is preferably 50 nm and is more preferably 70 nm. On the other hand, the upper limit of the average particle size of the sintered bodies 3a is preferably 300 nm and is more preferably 200 nm. When the average particle size of the sintered bodies 3a is smaller than the lower limit as described above, the oxidation resistance of the metal layer 3 may decrease. Conversely, when the average particle size of the sintered bodies 3a exceeds the upper limit as described above, it may be difficult to form the metal layer 3 that is sufficiently dense.

The lower limit of the average thickness of the metal layer 3 is preferably 100 nm and is more preferably 200 nm. On the other hand, the upper limit of the average thickness of the metal layer 3 is preferably 1000 nm and is more preferably 500 nm. By setting the average thickness of the metal layer 3 to be greater than or equal to the lower limit as described above, the resistance of the metal layer 3 can be reduced and therefore transmission losses can be suppressed in a case of application to manufacturing a printed circuit board for radio frequency signal processing, for example. On the other hand, when the average thickness of the metal layer 3 exceeds the upper limit as described above, the metal layer 3 may be unnecessarily thick, and the manufacturing efficiency of the base material 1 for a printed circuit board may decrease.

(Base Film)

The base film 2 is insulating. Examples of the main component of the base film 2 include a soft material such as polyimide, liquid crystal polyester, polyethylene terephthalate, polyethylene naphthalate, fluoropolymer, and the like. Among these, because of having high bonding strength with the sintered bodies 3a, polyimide, liquid crystal polyester, polyethylene terephthalate, and combinations thereof are preferable, and polyimide is more preferable. It should be noted that the base film 2 may be porous or may include a filler, am additive, and the like.

The thickness of the base film 2 is not particularly limited. For example, the lower limit of the average thickness of the base film 2 is preferably 5 μm and is more preferably 12 μm. On the other hand, the upper limit of the average thickness of the base film 2 is preferably 2 mm and is more preferably 1.6 mm. When the average thickness of the base film 2 is less than the lower limit as described above, the strength of the base film 2 may be insufficient. Conversely, when the average thickness of the base film 2 exceeds the upper limit as described above, it may be difficult to be applied to an electronic device that is required to be reduced in thickness and the flexibility may be insufficient.

In a case in which the sintered bodies 3a are formed using a conductive ink described later below, it is preferable that a hydrophilic treatment is applied to the surface of the base film 2 on which the metal layer 3 is layered (the fixed surface of the sintered bodies 3a). As the hydrophilic treatment, for example, a plasma treatment in which a fixing surface is hydrophilized by irradiation with a plasma or an alkali treatment in which a fixing surface is hydrophilized with an alkali solution can be used. Because the surface tension of the conductive ink with respect to the fixing surface is reduced by applying the hydrophilic treatment to the fixing surface, the conductive ink can be uniformly applied to the fixing surface.

As described above, the arithmetic mean roughness (Sa) of the surface of the base film 2 on which the metal layer 3 is layered is less than 0.10 μm. Also, the upper limit of the arithmetic mean roughness (Sa) is preferably 0.05 μm. When the arithmetic mean roughness (Sa) exceeds the upper limit, etching of a recessed portion of the surface of the base film 2 may not be easy, and the etching accuracy may decrease. Also, in a case in which a radio frequency is propagated to the metal layer 3, a signal is transmitted along protrusions/recesses of the surface of the base film 2 due to skin effect, so that the travel distance may be lengthened and losses may be increased. On the other hand, the lower limit of the arithmetic mean roughness (Sa) is not particularly limited, and can be, for example, 0.00 μm.

(Peel Strength between Base Film and Metal Layer)

The lower limit of the peel strength between the base film 2 and the metal layer 3 is preferably 6 N/cm and is more preferably 8 N/cm. By the peel strength being greater than or equal to the lower limit as described above, peeling between the base film 2 and the metal layer 3 is prevented, and a printed circuit board with high electrical connection reliability can be formed. On the other hand, the upper limit of the peel strength is not particularly limited, and can be, for example, 20 N/cm. The peel strength can be controlled by, for example, the amount of the sintered bodies 3a fixed to the base film 2, the sizes of the copper particles in the conductive ink, the sintering temperature and the sintering time at the time of sintering a coating film to be described later below. It should be noted that the "peel strength" refers to the peel strength obtained in the 180° direction peeling test in accordance with JIS-C6471:1995.

Second Embodiment

<Base Material for Printed Circuit Board>

Next, a base material 11 for a printed circuit board according to a second embodiment of the present disclosure will be described with reference to FIG. 2. The base material 11 for a printed circuit board includes: an insulating base film 2; and a metal layer 13 that is layered on one surface of the base film 2 and that includes copper as a main component. The base material 11 for a printed circuit board is a base material for a flexible printed circuit board and has flexibility. The metal layer 13 includes a seed layer 13a composed of the metal layer 3 of FIG. 1 that is directly layered on the base film 2, and an electroplating layer 13b layered on the outer surface of the seed layer 13a. The base material 11 for a printed circuit board has a configuration similar to that of the base material 1 for a printed circuit board of FIG. 1, with the exception that the metal layer 13 includes the electroplating layer 13b that is layered on the outer surface of the seed layer 13a. Therefore, only the electroplating layer 13b will be described below.

(Electroplating Layer)

The electroplating layer 13b is directly layered on the outer surface of the seed layer 13a. The electroplating layer 13b includes electroplating copper formed by electroplating. It is preferable that the electroplating copper is layered on the outer surface of the seed layer 13a and gaps between the sintered bodies 3a constituting the seed layer 13a are filled with the electroplating copper.

Because the seed layer 13a is formed densely in the base material 11 for a printed circuit board, the electroplating layer 13b can be directly layered on the outer surface of the seed layer 13a without interposing an electroless plating layer. By including the electroplating layer 13b, the base material 11 for a printed circuit board can increase the thickness of the metal layer 13 and can reduce the resistance of the metal layer 13. Therefore, according to the base material 11 for a printed circuit board, it is possible to suppress transmission losses in a case of application to manufacturing a printed circuit board for radio frequency signal processing, for example. In addition, according to the base material 11 for a printed circuit board, by layering the electroplating layer 13b directly on the outer surface of the seed layer 13a, while reducing the resistance of the metal layer 13, it is possible to easily suppress mixing of different metals into the metal layer 13. Thereby, it is possible to easily and reliably adjust the contents of various metal components in the region of 100 nm or less from the interface of the metal layer 13 with the base film 2 within the above described ranges.

By the metal layer 13 including the electroplating layer 13b, the thickness can be easily and reliably adjusted in a relatively short time. The average thickness of the metal layer 13 is set depending on the configuration of a printed circuit to be manufactured, is not particularly limited, and the lower limit of the thickness of the metal layer 13 is preferably 1 μm and is more preferably 2 μm. On the other hand, the upper limit of the average thickness is preferably 100 μm and is more preferably 50 μm. When the average thickness is less than the lower limit as described above, the metal layer 13 may easily be damaged. Conversely, when the average thickness exceeds the upper limit as described above, it may be difficult to be applied to an electronic device that is required to be reduced in thickness.

Third Embodiment

<Printed Circuit Board>

Figure 2:
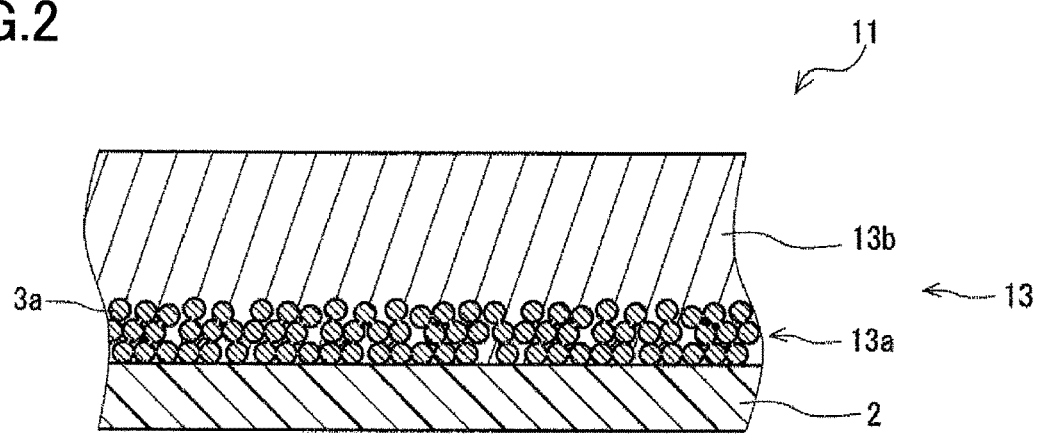
FIG. 2 is a schematic cross-sectional view illustrating a base material for a printed circuit board according to an embodiment different from that of the base material for a printed circuit board of FIG. 1.
Figure 3:
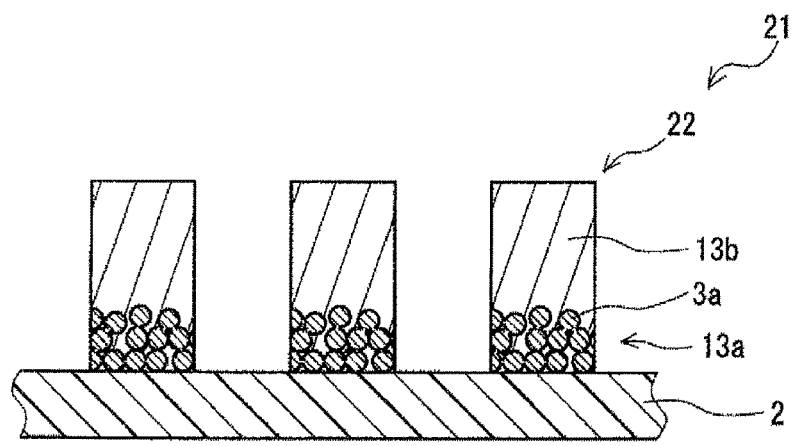
FIG. 3 is a schematic cross-sectional view illustrating a printed circuit board using the base material for a printed circuit board of FIG. 2.

The printed circuit board 21 of FIG. 3 uses the base material 11 for a printed circuit board of FIG. 2. The printed circuit board 21 includes a conductive pattern 22 on the one side surface of the base film 2. The conductive pattern 22 is obtained by patterning the metal layer 13 of the base material 11 for a printed circuit board and includes a portion of the metal layer 13. As the patterning method at this time, for example, a method (subtractive method) of etching by applying a masking such as a resist pattern to the metal layer 13 can be used. Because the printed circuit board 21 uses the base material 11 for a printed circuit board in which the contents of Cr and Ni per unit area in the region of 100 nm or less from the interface between the seed layer 13a and the base film 2 and the arithmetic mean roughness (Sa) of the surface of the base film 2 on which the metal layer 13 is layered are controlled in the ranges as described above, a fine circuit can easily be formed.

The printed circuit board 21 includes an electroplating layer 13b on the outer surface of the seed layer 13a. Because the seed layer 13a is dense, the printed circuit board 21 can be provided with the electroplating layer 13b directly on the outer surface of the seed layer 13a without layering an electroless plating layer on the outer surface of the seed layer 13a. Thereby, for the printed circuit board 21, it is possible to increase manufacturing efficiency and promote cost reduction.

<Method of Manufacturing Base material for Printed Circuit Board>

Next, a method of manufacturing a base material for a printed circuit board according to the present disclosure will be described with reference to FIG. 4A to FIG. 4C. First, with reference to FIG. 4A and FIG. 4B, a method of manufacturing the base material 1 for a printed circuit board of FIG. 1 will be described.

The method of manufacturing a base material for the printed circuit board includes a coating film formation step of forming a coating film 30 on one surface of the base film 2 by applying a conductive ink containing copper particles 3b and a metal layer formation step of forming a metal layer 3 containing sintered bodies 3a of copper particles 3b by sintering the coating film 30. In the method of manufacturing the base material for a printed circuit board, the contents per unit area in the region of 100 nm or less from the interface with the base film 2 of the metal layer 3 are adjusted so that $Cr<0.1$ mg/m$^2$ and $Ni<0.1$ mg/m$^2$. Further, in the method of manufacturing the base material for a printed circuit board, the arithmetic mean roughness (Sa) of the surface of the base film 2 on which the metal layer 3 is layered is controlled to be less than 0.10 μm. According to the method of manufacturing the base material for a printed circuit board, it is possible to manufacture the base material 1 for a printed circuit board as described above that enables to easily form a fine circuit. It should be noted that the method of manufacturing the base material for a printed circuit board may further include, prior to the coating film formation step, a hydrophilic treatment step of applying a hydrophilic treatment to one surface (surface on which the coating film 30 is to be formed) of the base film 2. Examples of the hydrophilic treatment method in the hydrophilic treatment step includes a plasma treatment in which one surface of the base film 2 is hydrophilized by irradiation with a plasma or an alkali treatment in which one surface of the base film 2 is hydrophilized by an alkali solution. Further, in the method of manufacturing the base material for a printed circuit board, prior to the coating film formation step, a wet blasting device, a sandblasting treatment, or the like may be applied to the one surface of the base film 2 so that the arithmetic mean roughness (Sa) is within the above described range.

(Coating Film Formation Step)

Figure 4A:
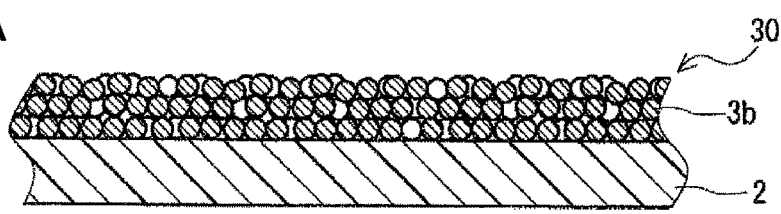
FIG. 4A is a schematic cross-sectional view illustrating a coating formation step of a method of manufacturing the base material for a printed circuit board of FIG. 1.

In the coating film formation step, as illustrated in FIG. 4A, a conductive ink including copper particles 3b is applied to the one surface of the base film 2, and the conductive ink is dried to form a coating film 30. It should be noted that the coating film 30 may include a dispersion medium of the conductive ink or the like.

<Copper Particles>

The copper particles 3b to be dispersed in the conductive ink can be manufactured by a high temperature treatment, a liquid phase reduction method, a gas phase method, or the like. Among these, according to the liquid phase reduction method, the manufacturing cost can be further reduced, and the particle sizes of the copper particles 3b can be easily made uniform by stirring in an aqueous solution or the like.

In order to manufacture copper particles 3b by a liquid phase reduction method, for example, a dispersant and a water-soluble metal compound to be an origin of copper ions that form the copper particles 3b are dissolved in water and a reducing agent is added to cause a reduction reaction with the copper ions for a certain period of time. The copper particles 3b, which are manufactured by the liquid phase reduction method, have uniform spherical or granular shapes and can be fine particles. As the water-soluble copper compound to be the origin of the copper ions, for example, copper(II) nitrate ($Cu(NO_3)_2$), copper(II) sulfate pentahydrate ($CuSO_4.5H_2O$), or the like can be used.

As the reducing agent, various reducing agents capable of reducing and precipitating copper ions in the reaction system of a liquid phase (aqueous solution) can be used. Examples of the reducing agent include sodium borohydride, sodium hypophosphite, hydrazine, transition metal ions such as trivalent titanium ions and divalent cobalt ions, ascorbic acid, reducing sugars such as glucose and fructose, polyhydric alcohols such as ethylene glycol and glycerol, and the like. Among them, trivalent titanium ions are preferable as a reducing agent. It should be noted that the liquid phase reduction method using trivalent titanium ions as a reducing agent is referred to as a titanium redox method. In the titanium redox method, copper ions are reduced by the oxidation-reduction effect when trivalent titanium ions are oxidized to tetravalent titanium ions such that the copper particles $3b$ are precipitated. Copper particles $3b$ that are obtained by the titanium redox method have small and uniform particle sizes. Therefore, the copper particles $3b$ are more densely packed, and a coating film 30 can be formed into a denser film. It should be noted that in the method of manufacturing the base material for a printed circuit board, for example, by adjusting the content of titanium ions in the conductive ink, the content of Ti per unit area in the region of 100 nm or less from the interface of the metal layer 3 with the base film 2 in the obtained base material 1 for a printed circuit board can be controlled to be in the range described above.

To adjust the particle sizes of the copper particles $3b$, the types and the mixing ratio of the copper compound, the dispersant, and the reducing agent may be adjusted, and the stirring rate, the temperature, the time, the pH, and the like at the time of subjecting the metal compound to a reduction reaction may be adjusted. The lower limit of the pH of the reaction system is preferably 7, and the upper limit of the pH of the reaction system is preferably 13. By setting the pH of the reaction system in the above described range, it is possible to obtain copper particles $3b$ having small particle sizes. At this time, by using a pH modifier, it is easy to adjust the pH of the reaction system in the range described above. Examples of the pH modifier that can be used include common acids and alkalis, such as hydrochloric acid, sulfuric acid, sodium hydroxide, sodium carbonate, and ammonia. In particular, to prevent the degradation of peripheral members, nitric acid and ammonia, which does not contain impurity elements such as alkali metals, alkaline-earth metals, halogen elements such as chlorine, sulfur, phosphorus, and boron, are preferable.

The lower limit of the average particle size of the copper particles $3b$ is preferably 10 nm and is more preferably 15 nm. On the other hand, the upper limit of the average particle size of the copper particles $3b$ is preferably 40 nm and is more preferably 35 nm. When the average particle size of the copper particles $3b$ is smaller than the lower limit as described above, the dispersibility and stability of the copper particles $3b$ in the ink may decrease. Conversely, when the average particle size of the copper particles $3b$ exceeds the upper limit as described above, the copper particles $3b$ may be easily precipitated, and the density of the copper particles $3b$ may be uneven when the conductive ink is applied. It should be noted that the "average particle size" refers to the average particle size that is represented by the volume center diameter D50 of the particle size distribution of copper particles in a dispersion liquid.

The lower limit of the content rate of the copper particles $3b$ in the conductive ink is preferably 5% by mass, is more preferably 10% by mass, and is further more preferably 20% by mass. Also, the upper limit of the content rate of the copper particles $3b$ in the conductive ink is preferably 50% by mass, is more preferably 40% by mass, and is further more preferably 30% by mass. By setting the content rate of the copper particles $3b$ to be greater than or equal to the lower limit, the coating film 30 can be formed into a denser film. On the other hand, when the content rate of the copper particles $3b$ exceeds the upper limit, the film thickness of the coating 32 may be uneven.

<Other Components>

The conductive ink may contain a dispersant other than copper particles $3b$. As a dispersant, various dispersants that can satisfactorily disperse the copper particles $3b$ can be used without being particularly limited.

To prevent the degradation of peripheral members, the dispersant preferably does not contain sulfur, phosphorus, boron, halogen and alkali. Preferable examples of the dispersant, having a molecular weight within a range described below, include amine-based polymeric dispersants such as polyethyleneimine and polyvinylpyrrolidone; hydrocarbon-based polymeric dispersants having a carboxylic acid group in its molecule, such as polyacrylic acid and carboxymethyl cellulose; polymeric dispersants having a polar group, such as Poval (polyvinyl alcohol), styrene-maleic acid copolymers, olefin-maleic acid copolymers, and copolymers having a polyethyleneimine moiety and a polyethylene oxide moiety in one molecule thereof.

The lower limit of the molecular weight of the dispersant is preferably 2,000, and the upper limit of the molecular weight of the dispersant is preferably 54,000. By using the dispersant having a molecular weight within the range as described above, it is possible to disperse the copper particles $3b$ satisfactorily in the conductive ink, and it is possible to make the film quality of the coating film 30 dense and defect-free. When the molecular weight of the dispersant is less than the lower limit as described above, the effect of preventing the aggregation of the copper particles $3b$ to maintain the dispersion may not be sufficiently obtained. Conversely, when the molecular weight of the dispersant exceeds the upper limit as described above, the dispersant may become excessively bulky, and at the time of sintering of the coating film 30, sintering of the copper particles $3b$ may be inhibited and voids may be generated. Also, when the dispersant is excessively bulky, the density of the coating film 30, and the decomposition residues of the dispersant may decrease the conductivity.

The dispersant can also be added to the conductive ink in a state of a solution dissolved in water or a water-soluble organic solvent. In a case in which the dispersant is mixed in the conductive ink, the lower limit of the content rate of the dispersant is preferably 1 part by mass per 100 parts by mass of the copper particles $3b$. The upper limit of the content rate of the dispersant is preferably 60 parts by mass per 100 parts by mass of the copper particles $3b$. When the content rate of the dispersant is less than the lower limit, the effect of preventing the aggregation of the copper particles $3b$ may be insufficient. Conversely, when the content rate of the dispersant exceeds the upper limit, at the time of sintering the coating film 30, an excessive dispersant may inhibit sintering of the copper particles $3b$ and voids may be generated. Further, the decomposition residues of the dispersant may remain as impurities in the sintered bodies $3a$ to decrease the conductivity.

For example, water can be used as the dispersion medium in the conductive ink. In a case in which the dispersion medium is water, the lower limit of the content rate of the water is preferably 20 parts by mass with respect to 100 parts by mass of the copper particles $3b$. Also, the upper limit of the content rate of the water is preferably 1,900 parts by mass with respect to 100 parts by mass of the copper particles $3b$. Although water that is the dispersion medium serves, for example, to sufficiently swell the dispersant and to satisfactorily disperse the copper particles $3b$ surrounded by the dispersant, when the content rate of the water is less than the lower limit, the swelling effect of the dispersant may be insufficient. On the other hand, when the content rate of water exceeds the upper limit, the content rate of the copper particles 3b in the conductive ink decreases, and a favorable metal layer 3 having the required thickness and density may not be formed.

It should be noted that in the case of manufacturing the copper particles 3b by the liquid-phase reduction method, the copper particles 3b precipitated in a liquid-phase reaction system (aqueous solution) can be prepared by using a conductive ink that has been made into a powder through steps of filtration, washing, drying, disintegration, and the like. In this case, the powdery copper particles 3b, water or the like that is a dispersion medium, optionally, a dispersant, and a water-soluble organic solvent can be mixed at predetermined proportions to prepare a conductive ink containing the copper particles 3b. At this time, it is preferable to prepare the conductive ink with a liquid phase (aqueous solution), in which the copper particles 3b have been precipitated, as a starting material. Specifically, the liquid phase (aqueous solution) containing the precipitated copper particles 3b is subjected to treatment, such as ultrafiltration, centrifugal separation, washing with water, or electrodialysis, to remove impurities and, optionally, is concentrated to remove water.

Alternatively, after water is added to adjust the concentration of the copper particles 3b, and, optionally, a water-soluble organic solvent is further added at a predetermined proportion, thereby preparing a conductive ink containing the copper particles 3b. By this method, it is possible to prevent generation of coarse and irregular particles due to aggregation at the time of drying the copper particles 3b, and it is easy to form dense and uniform sintered bodies 3a.

<Application Method of Conductive Ink>

As a method of applying a conductive ink in which the copper particles 3b are dispersed to the one surface of the base film 2, a known application method, such as a spin coating method, a spray coating method, a bar coating method, a die coating method, a slit coating method, a roll coating method, or a dip coating method, can be used. Also, the conductive ink may be applied to only part of the one surface of the base film 2 by screen printing, a dispenser, or the like. After application of the conductive ink, the coating film 30 is formed, for example, by drying at a temperature greater than or equal to room temperature. The upper limit of the drying temperature is preferably 100° C. and is more preferably 40° C. When the drying temperature exceeds the upper limit as described above, due to rapid drying of the coating film 30, cracks may occur in the coating film 30.

(Metal Layer Formation Step)

Figure 4B:
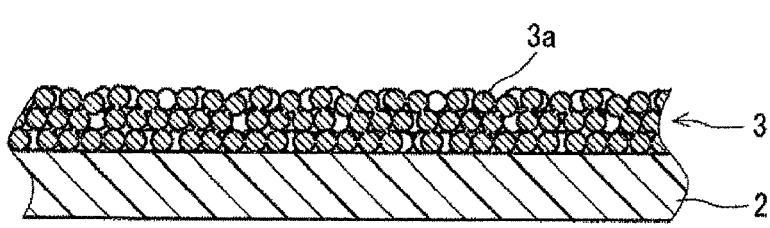
FIG. 4B is a schematic cross-sectional view illustrating a metal layer formation step of the method of manufacturing the base material for a printed circuit board of FIG. 1.
Figure 4C:
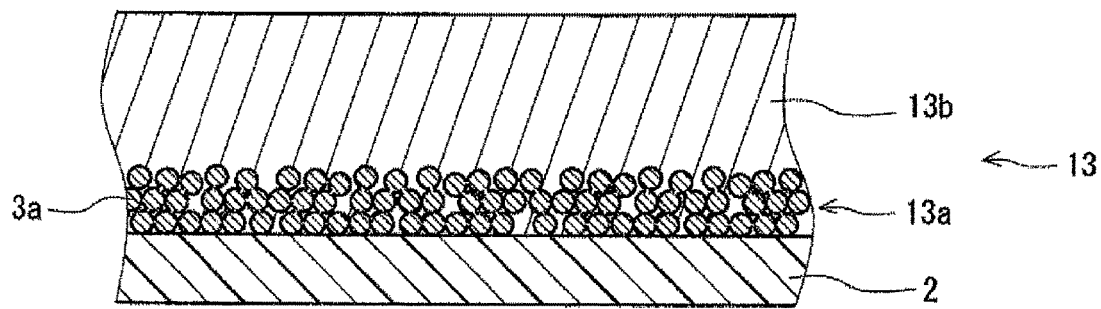
FIG. 4C is a schematic cross-sectional view illustrating an electroplating layer layering step of a method of manufacturing the base material for a printed circuit board of FIG. 2.

In the metal layer formation step, as illustrated in FIG. 4B, the metal layer 3 including the sintered bodies 3a of the copper particles 3b is formed by sintering the coating film 30.

<Sintering>

By the sintering, the copper particles 3b are sintered with each other and the sintered bodies 3a are adhered to the one surface of the base film 2. It should be noted that most of the dispersant and other organic substances that may be included in the conductive ink are volatilized or decomposed by sintering. Also, in the vicinity of the interface of the sintered bodies 3a with the base film 2, because the copper particles 3b are oxidized by sintering, while suppressing generation of a copper hydroxide based on the copper particles 3b and a group derived from the copper hydroxide, a copper oxide based on the copper particles 3b and a group derived from the copper oxide are generated. The copper oxide and the group derived from the copper oxide generated in the vicinity of the interface between the sintered bodies 3a and the base film 2 are strongly bonded to resin such as polyimide constituting the base film 2, and therefore the adhesion between the base film 2 and the sintered bodies 3a increases.

The sintering is preferably performed in an atmosphere containing a certain amount of oxygen in order to prompt oxidation of the copper particles 3b in the vicinity of the interface of the sintered bodies 3a with the base film 2. In this case, the lower limit of the oxygen concentration in the sintering atmosphere is preferably 1 ppm by volume, and is more preferably 10 ppm by volume. On the other hand, the upper limit of the oxygen concentration is preferably 10,000 ppm by volume, and is more preferably 1,000 ppm by volume. When the oxygen concentration is less than the lower limit, the amount of the copper oxide and the group derived from the copper oxide generated in the vicinity of the interface of the sintered bodies 3a with the base film 2 may decrease, and the adhesion between the base film 2 and the sintered bodies 3a may not be sufficiently enhanced. Conversely, when the oxygen concentration exceeds the upper limit, the copper particles 3b may be excessively oxidized, and the conductivity of the sintered bodies 3a may decrease.

The lower limit of the sintering temperature is preferably 150° C., and is more preferably 200° C. On the other hand, the upper limit of the sintering temperature is preferably 500° C., and is more preferably 400° C. When the sintering temperature is lower than the lower limit, the amount of the copper oxide and the group derived from the copper oxide generated in the vicinity of the interface of the sintered bodies 3a with the base film 2 may be decrease, and the adhesion between the base film 2 and the sintered bodies 3a may not be sufficiently enhanced. Conversely, when the sintering temperature exceeds the upper limit, the base film 2 may deform. It should be noted that the sintering time is not particularly limited, but may be, for example, in a range of greater than or equal to 30 minutes and less than or equal to 600 minutes.

In the method of manufacturing the base material for a printed circuit board, the base material 1 for a printed circuit board in FIG. 1 can be manufactured by the coating film formation step and the metal layer formation step described above. Meanwhile, according to the method of manufacturing the base material for a printed circuit board, as illustrated in FIG. 4C, by including the electroplating layer layering step of layering the electroplating layer 13b on the outer surface of the seed layer 13a made of the metal layer 3 of FIG. 4B, the base material 11 for a printed circuit board of FIG. 2 described above can be manufactured. In the method of manufacturing the base material for a printed circuit board, by including the electroplating layer layering step, the thickness of the metal layer 13 can be increased and the resistance of the metal layer 13 can be reduced. Therefore, the method of manufacturing the base material for a printed circuit board is suitable as a method of manufacturing a base material for a printed circuit board that is used for, for example, a printed circuit board for radio frequency signal processing.

(Electroplating Layer Layering Step)

In the electroplating layer layering step, by electro copper plating, the electroplating layer 13b is layered on the outer surface of the seed layer 13a. In the electroplating layer layering step, it is preferable to form the electroplating layer 13b by using a catalyst and plating solution having as little heterogeneous metals as possible so as not to affect the contents of respective various metal components in the region of 100 nm or less from the interface with the base film 2 of the seed layer 13a. The procedure of the electroplating layer layering step is not particularly limited and may be suitably selected from known electro copper plating baths and plating conditions, for example.

<Method of Manufacturing Printed Circuit Board>

Figure 5:
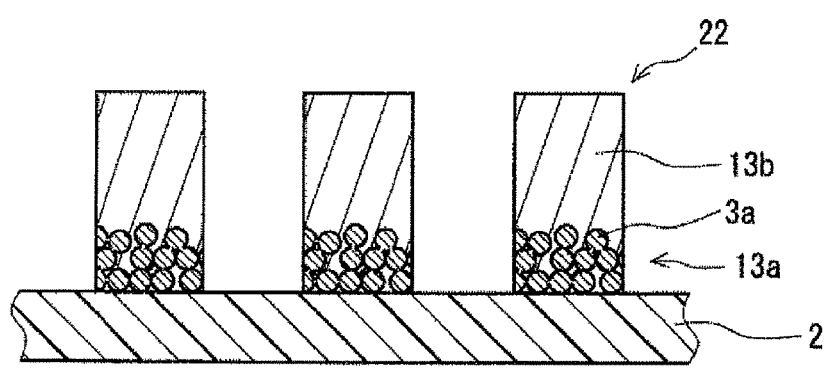
FIG. 5 is a schematic cross-sectional view illustrating an etching step of a method of manufacturing the printed circuit board of FIG. 3.

Next, one embodiment of a method of manufacturing a printed circuit board according to the present disclosure will be described with reference to FIG. 5. Here, a method of manufacturing the printed circuit board 21 of FIG. 3 using the base material 11 for a printed circuit board of FIG. 2 will be described. The method of manufacturing the printed circuit board includes an etching step of etching by applying to the metal layer 13 a masking such as a resist pattern or the like.

(Etching Step)

In the etching step, it is preferable to remove portions of the seed layer 13a between the conductive pattern 22 by single etching. In the method of manufacturing the printed circuit board, because of using the base material 11 for a printed circuit board in which the contents of Cr and Ni per unit area in the region of 100 nm or less from the interface between the seed layer 13a and the base film 2 is within the above described ranges, etching of metals other than copper is not required to be performed separately. According to the method of manufacturing the printed circuit board, by the etching step, it is possible easily form a fine circuit.

Other Embodiments

The embodiments disclosed above should be considered exemplary in all respects and not limiting. The scope of the present invention is not limited to configurations of the above described embodiments, but is indicated by claims and is intended to include all changes within the meaning and scope of equivalence with the claims.

For example, in the base material for a printed circuit board, a metal layer may not be formed only one surface of the base film, and a metal layer may be layered on both surfaces of the base film.

As described above, it is preferable that the metal layer includes sintered bodies of copper particles fixed to a base film. However, as long as the contents of Cr and Ni per unit area in the region of 100 nm or less from the interface with the base film of the metal layer is within the ranges described above, the metal layer may not necessarily include sintered bodies of copper particles fixed to the base film.

The base material for a printed circuit board need not necessarily be a base material for a flexible printed circuit board, but may be rigid base material. In this case, examples of the main component of a base film include hard materials, such as paper phenol, paper epoxy, glass composite, glass epoxy, and glass base material; rigid-flexible materials in which hard materials and soft materials are combined, and the like.

The printed circuit board may be formed using, for example, the base material 1 for a printed circuit board of FIG. 1. The printed circuit board may also include an electroless plating layer on the outer surface of the seed layer.

Although an example has been described in which a conductive pattern is formed by a subtractive method in the embodiment as described above, the method for manufacturing a printed circuit board may form a conductive pattern by a semi-additive method.

EXAMPLES

Although the present disclosure will be described below in detail with reference to Examples, the present disclosure is not limited to the Examples.

Examples

No. 1

80 g (0.1 M) of a titanium trichloride solution as a reducing agent, 50 g of sodium carbonate as a pH modifier, 90 g of sodium citrate as a complexing agent, and 1 g of PEI-PEO graft copolymer as a dispersant were dissolved in 1 L of pure water in a beaker, and the aqueous solution was kept at 35° C. Also, to the aqueous solution, 10 g (0.04 M) of an aqueous solution of copper nitrate trihydrate kept at the same temperature (35° C.) was added and stirred so that copper fine particles were precipitated. Furthermore, with respect to the copper fine particles separated by centrifugation, after repeating a water washing step by 200 mL of pure water twice and then drying the copper fine particles, powdered copper fine particles were obtained. The average particle size D50 of the fine copper particles was 30 nm. Subsequently, by adding pure water to the powdered fine copper particles to adjust the concentration, a conductive ink having a content rate of 30% by mass of the fine copper particles was manufactured. Further, a coating film was formed by applying 300 µL of the conductive ink by a bar-coating method to a base film consisting of a polyimide film (10 cm square) subjected to a hydrophilic treatment. Then, by sintering the coating film at 350° C., a metal layer made of sintered bodies of the copper particles was formed, and No. 1 of the base material for a printed circuit board was prepared. The average particle size of the sintered bodies of the copper particles was 105 nm when measured by a SEM device "SU8020" manufactured by Hitachi High-Tech Corporation. The contents of Cr, Ni, Pd, and Ti per unit area in the region of 100 nm or less from the interface with the base film of the metal layer of No. 1 of the base material for a printed circuit board was measured by ICP-MS ("ICP-MS 7700x" manufactured by Agilent Technologies, Inc). In addition, the arithmetic mean roughness (Sa) of the surface of the base film on which the metal layer is stacked was measured with a measuring range of 30 µm×30 µm and a cut-off value of 90. The measurement results are indicated in Table 1.

No. 2 and No. 3

With the exception of setting the average particle size of sintered bodies of copper particles, the contents of Cr, Ni, Pd, and Ti per unit area in the region of 100 nm or less from the interface with the base film of the metal layer, and the arithmetic mean roughness (Sa) of the surface of the base film on which the metal layer is layered as indicated in Table 1, No. 2 and No. 3 of the base materials for printed circuit boards were prepared similarly to No. 1.

Comparative Example

No. 4

No. 4 of the base material for a printed circuit board was prepared by layering, on a base film consisting of a polyimide film (10 cm square), a nickel-chromium alloy layer and a copper layer in this order by a sputtering method. For No. 4 of the base material for a printed circuit board, the measurement results of the contents of Cr, Ni, Pd, and Ti per unit area in the region of 100 nm or less from the interface with the base film of the metal layer and the arithmetic mean roughness (Sa) of the surface of the base film on which the metal layer is layered measured by methods similar to those as described above are indicated in Table 1.

No. 5

By layering copper foil via an adhesive layer on a base film made of polyimide film (10 cm square), No. 5 of the base material for a printed circuit board was prepared in which a metal layer made of copper foil was layered on one surface of the base film. For No. 5 of the base material for a printed circuit board, the measurement results of the contents of Cr, Ni, Pd, and Ti per unit area in the region of 100 nm or less from the interface with the base film of the metal layer (the interface of the base film side of the metal layer) and the arithmetic mean roughness (Sa) of the surface of the base film on which the metal layer is layered measured by methods similar to those as described above are indicated in Table 1.

No. 6

No. 6 of the base material for a printed circuit board was prepared by layering, on a base film consisting of a polyimide film (10 cm square), a nickel-chromium alloy layer and a copper layer in this order by a sputtering method. For No. 6 of the base material for a printed circuit board, the measurement results of the contents of Cr, Ni, Pd, and Ti per unit area in the region of 100 nm or less from the interface with the base film of the metal layer and the arithmetic mean roughness (Sa) of the surface of the base film on which the metal layer is layered measured by methods similar to those as described above are indicated in Table 1.

No. 7

With the exception of setting the average particle size of sintered bodies of copper particles, the contents of Cr, Ni, Pd, and Ti per unit area in the region of 100 nm or less from the interface with the base film of the metal layer, and the arithmetic mean roughness (Sa) of the surface of the base film on which the metal layer is layered as indicated in Table 1, No. 7 of the base material for a printed circuit board was prepared similarly to No. 1.

<Formability of Fine Circuit>

For each of No. 1 to No. 7, etching was performed by applying a resist pattern to the surface of the metal layer of the base material for a printed circuit board such that L/S (Line & Space)=10 μm/10 μm. Specifically, after it was immersed in 1 wt % sodium dodecyl sulfate aqueous solution, it was immersed in CA5330 (manufactured by MEC COMPANY LTD.). The etch results are indicated in Table 1. It should be noted that, in Table 1, "A" indicates that a circuit of L/S=10 μm/10 μm was formed, and "B" indicates that a circuit of L/S=10 μm/10 μm was not formed.

TABLE 1

|  | CONTENT [mg/m$^2$] | | | | ARITHMETIC MEAN ROUGHNESS | AVERAGE PARTICLE SIZE OF SINTERED | FORMABILITY OF FINE |
| --- | --- | --- | --- | --- | --- | --- | --- |
|  | Cr | Ni | Pd | Ti | (Sa) [μm] | BODIES [nm] | CIRCUIT |
| No. 1 | <0.1 | <0.1 | <1 | 0.004 | 0.02 | 105 | A |
| No. 2 | <0.1 | <0.1 | <1 | 0.048 | 0.06 | 85 | A |
| No. 3 | <0.1 | <0.1 | <1 | 0.021 | 0.08 | 97 | A |
| No. 4 | 14 | 14 | <1 | <0.001 | 0.02 | — | B |
| No. 5 | <0.1 | <0.1 | <1 | <0.001 | 0.50 | — | B |
| No. 6 | 0.3 | 0.2 | <1 | <0.001 | 0.02 | — | B |
| No. 7 | <0.1 | <0.1 | <1 | 0.030 | 0.14 | 89 | B |

<Evaluation Results>

As indicated in Table 1, in No. 1 to No. 3 of the base materials for printed circuit boards, the contents of Cr and Ni per unit area in the region of 100 nm or less from the interface with the base film of the metal layer are the above ranges and the arithmetic mean roughness (Sa) of the surface the base film on which the metal layer of is layered is the above values. Therefore, etching of the metal layer could be performed with high accuracy, and as a result, fine circuits could be formed. On the other hand, in No. 4 and No. 6 of the base materials for printed circuit boards, the contents of Cr and Ni per unit area per unit area in the region of 100 nm or less from the interface with the base film of the metal layer are greater than or equal to 0.1 mg/m$^2$, and in No. 5 and No. 7 of the base materials for printed circuit boards, the arithmetic mean roughness (Sa) of the surface the base film on which the metal layer of is layered is greater than or equal to 0.10 μm. Therefore, etching was difficult, high-accuracy etching could not be performed, and fine circuits could not be formed.

DESCRIPTION OF REFERENCE NUMERALS 1, 11 base material for a printed circuit board
2 base film
3, 13 metal layer
3a sintered bodies
3b copper particles
13a seed layer
13b electroplating layer
21 printed circuit board
22 conductive pattern
30 coating film

The invention claimed is:
1. A base material for a printed circuit board comprising:
an insulating base film; and
a metal layer that is layered on at least one surface of the base film and that includes copper as a main component, wherein in a content per unit area in a region of 100 nm or less from an interface of the metal layer with the base film, Cr<0.1 mg/m$^2$, and Ni<0.1 mg/m$^2$, wherein an arithmetic mean roughness (Sa) of the surface of the base film on which the metal layer is layered is less than 0.10 μm.

2. The base material for a printed circuit board according to claim 1, wherein the metal layer includes sintered bodies of copper particles fixed to the base film.

3. The base material for a printed circuit board according to claim 2, wherein an average particle size of the sintered bodies is greater than or equal to 50 nm and less than or equal to 300 nm.

4. The base material for a printed circuit board according to claim 1, wherein in the content per unit area in the region of 100 nm or less from the interface of the metal layer with the base film, Pd<0.1 mg/m$^2$.

5. The base material for a printed circuit board according to claim 1, wherein in the content per unit area in the region of 100 nm or less from the interface of the metal layer with the base film, 0.001 mg/m$^2 \leq$ Ti $\leq$ 0.05 mg/m$^2$.

6. The base material for a printed circuit board according to claim 2, wherein an average particle size of the sintered bodies is greater than or equal to 70 nm and less than or equal to 200 nm.

7. A printed circuit board using the base material for a printed circuit board according to claim 1.

8. The printed circuit board according to claim 7, further comprising an electroplating layer on an outer surface of the metal layer.

\* \* \* \* \*